United States Patent
Ashe et al.

(10) Patent No.: US 8,413,023 B2
(45) Date of Patent: Apr. 2, 2013

(54) ERROR-LOCATOR-POLYNOMIAL GENERATION WITH ERASURE SUPPORT

(75) Inventors: Vincent Brendan Ashe, Campbell, CA (US); Hakan C. Ozdemir, Los Gatos, CA (US); Razmik Karabed, San Jose, CA (US); Richard Barndt, San Diego, CA (US)

(73) Assignee: STMicroelectronics, Inc., Carrollton, TX (US)

( * ) Notice: Subject to any disclaimer, the term of this patent is extended or adjusted under 35 U.S.C. 154(b) by 599 days.

(21) Appl. No.: 12/651,392

(22) Filed: Dec. 31, 2009

(65) Prior Publication Data

US 2010/0174969 A1 Jul. 8, 2010

Related U.S. Application Data

(60) Provisional application No. 61/142,030, filed on Dec. 31, 2008.

(51) Int. Cl.
*G06F 11/00* (2006.01)
(52) U.S. Cl. .................................................... 714/781
(58) Field of Classification Search .................. None
See application file for complete search history.

(56) References Cited

U.S. PATENT DOCUMENTS

| | | | | |
|---|---|---|---|---|
| 6,131,178 A * | 10/2000 | Fujita et al. | | 714/784 |
| 6,381,726 B1 * | 4/2002 | Weng | | 714/780 |
| 6,449,746 B1 * | 9/2002 | Truong et al. | | 714/784 |
| 6,662,338 B1 | 12/2003 | Rezzi et al. | | |
| 7,870,469 B1 * | 1/2011 | Wu | | 714/784 |
| 2004/0010748 A1 | 1/2004 | Ozdemir | | |
| 2004/0010749 A1 | 1/2004 | Ozdemir | | |
| 2010/0169746 A1 | 7/2010 | Karabed | | |

OTHER PUBLICATIONS

Reed, I.S., Shih, M.T., Trougn, T.K., VLSI Design of Inverse-Free Berrlekamp-Massey, IEE Proceedings-E, Sep. 1991, 295-298, vol. 138, No. 5.
Forney, Jr., G. David, on Decoding BCH Codes, IEEE Transactions on Information Theory, Oct. 1965, 549-557, vol. 11, No. 10.
Jeng, Jyh-Horng, Truong, Trieu-Kien, On Decoding of Both Errors and Erasures of a Reed-Solomon Code Using an Inverse-Free Berlekamp-Massey Algorithm, IEEE Transactions on Communications, Oct. 1999, 1488-1494, vol. 47, No. 10.
Kang, Hyeong-Ju, Park, In-Cheol, A High-Speed and Low-Latency Reed-Solomon Decoder Based on a Dual-Line Structure, 2002 IEEE International Acoustics, Speech, and Signal Processing (ICASSP), May 2002, 3180-3183, vol. 3.
Tan, Weijun, Cruz, J.R., Detection of Media Defects in Perpendicular Magnetic Recording Channels, IEEE Transactions on Magnetics, Oct. 2005, 2956-2958, vol. 41, No. 10.
Truong, Trieu-Kien, Jeng, J.H., Hung, King-Chu, Inversionless Decoding of Both Errors and Erasures of Reed-Solomon Code, IEEE Transactions on Communications, Aug. 1998, 973-976, vol. 46, No. 8.

* cited by examiner

*Primary Examiner* — Michael Maskulinski
(74) *Attorney, Agent, or Firm* — Graybeal Jackson LLP

(57) ABSTRACT

A system and method for correcting errors in an ECC block using erasure-identification data when generating an error-locator polynomial. In an embodiment, a ECC decoding method, uses "erasure" data indicative of bits of data that are unable to be deciphered by a decoder. Such a method may use an Berlekamp-Massey algorithm that receives two polynomials as inputs; a first polynomial indicative of erasure location in the stream of bits and a syndrome polynomial indicative of all bits as initially determined. The Berlekamp-Massey algorithm may use the erasure identification information to more easily decipher the overall codeword when faced with a error-filled codeword.

23 Claims, 3 Drawing Sheets

ERROR-LOCATOR-POLYNOMIAL GENERATION WITH ERASURE SUPPORT

PRIORITY CLAIM TO PROVISIONAL PATENT APPLICATION

This patent application claims priority to U.S. Provisional Patent Application No. 61/142,030 entitled 'ERROR-LOCATOR-POLYNOMIAL GENERATION WITH ERASURE SUPPORT' filed on Dec. 31, 2008 and is hereby incorporated by reference.

BACKGROUND

A data-communications system, such as a computer disk drive or a cell phone, includes a read channel, which recovers data from a received read signal (sometimes called a data signal) by interpreting a stream of bits. Such systems may read and write data to and from storage mediums and/or communication channels at ever-increasing rates. With the increase in data throughput, software and hardware may need to be more and more resilient to noise-induced errors. Thus, many communication and computer systems employ error-checking data processing that may be both hardware and software based in order to recover data if noise-induced errors arise.

BRIEF DESCRIPTION OF THE DRAWINGS

Embodiments of the subject matter disclosed herein will become more readily appreciated as the same become better understood by reference to the following detailed description, when taken in conjunction with the accompanying drawings.

DETAILED DESCRIPTION

Figure 1:
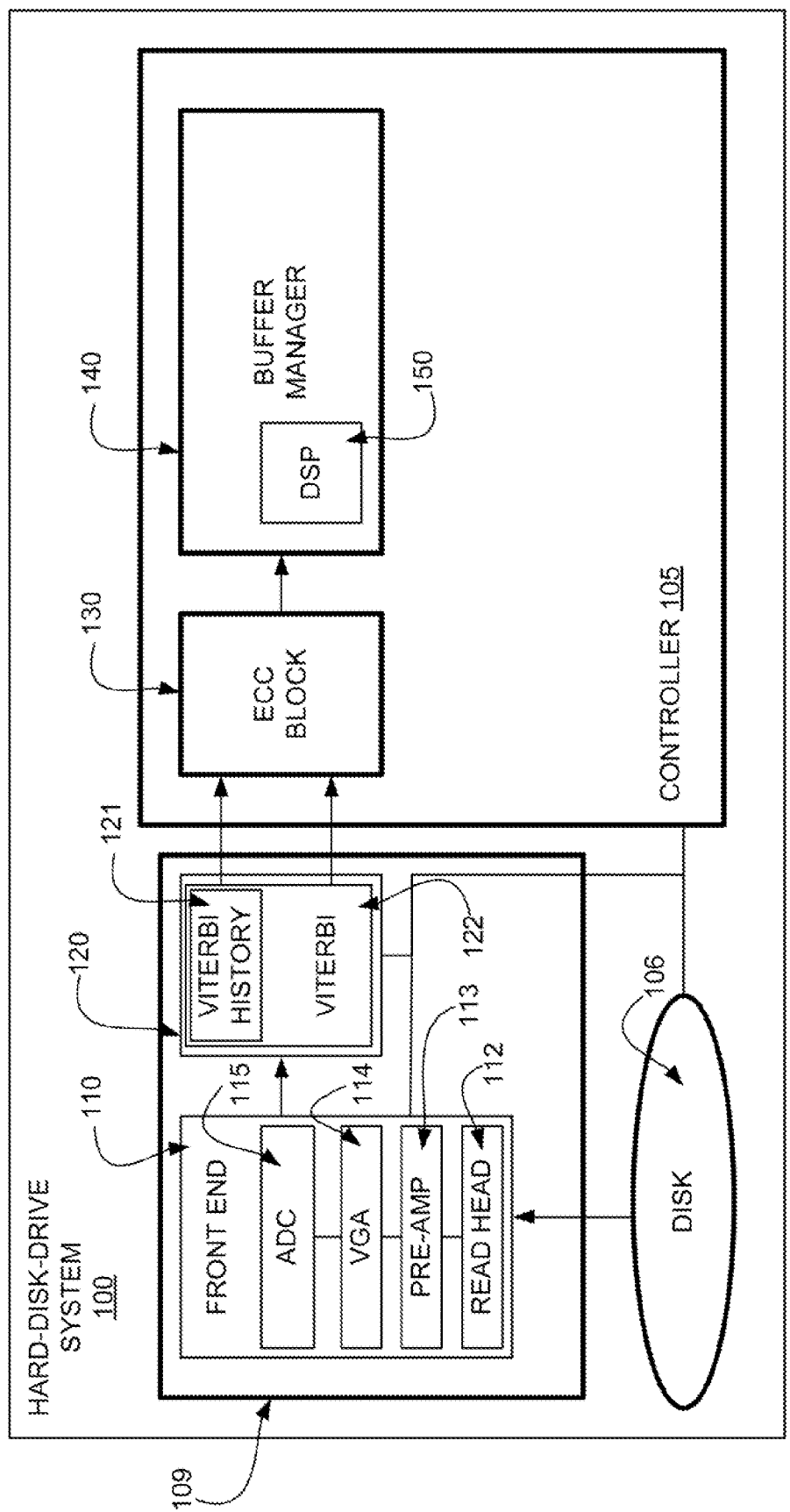
FIG. 1 is a block diagram of an embodiment of a hard-disk-drive system that may use soft data for error-checking.

The following discussion is presented to enable a person skilled in the art to make and use the subject matter disclosed herein. The general principles described herein may be applied to embodiments and applications other than those detailed above without departing from the spirit and scope of the present detailed description. The present disclosure is not intended to be limited to the embodiments shown, but is to be accorded the widest scope consistent with the principles and features disclosed or suggested herein.

Error Correction Coding (ECC) is a method wherein errors during the reading of data may be corrected through statistical interpolation of the data itself when coded in a known manner. For example, in a computer system having a hard-disk drive, when the computer system (i.e., a host system for the hard-disk system) writes data to or reads data from the disk, the data may be checked for errors that may arise due to noise and inter-symbol interference (ISI). In specific, during a read data process, errors in reading the data may occur from various problems that may be encountered in the read channel of a disk drive system. Such errors may cause one or more bits to be read out incorrectly; e.g., the read channel may interpret a bit as "0" when the bit should be "1" and vice versa.

Error Correction Coding (ECC) may be implemented as a function of statistical interpolation based on the data as it is read as well as other meta-data that is stored with the functional data from a storage medium. ECC is a mathematically-intensive process, but may greatly increase the reliability of data being read from a medium. As such, with the increased ability of hard-drive systems and other communications systems to transmit and receive data at greater speeds, improvements in ECC may complement the ability of such systems as well.

Hard-disk drive (HDD) systems and communication channels may use an ECC module to attempt to correct errors that may arise due to reading data incorrectly due to external noise within a particular system. BCH codes (as generally based upon the error correction coding algorithms developed by Bose and Ray-Chaudhiri—in which the acronym BCH derives from these inventor's names) allow algebraic syndrome decoding to be used to find and fix bit-reading errors. One particular BCH coding schema is Reed-Solomon (RS) coding. RS Coding is a form of the general BCH code wherein bits of data are grouped into symbols rather than being handled as individual bits. Generally speaking, sometimes the number of errors present in the symbols of the RS code are too numerous to fix using conventional methods. The errors may typically arise from noise and ISI or from an erasure. An erasure may be a bit or grouping of bits that a read channel is unable to definitively determine one way or another as to what the bits may actually be. As such, erasures may be handled differently as no assumption is made as to the possible validity of the initial interpretation.

Prior to discussing the figures and by way of initial overview, a summary of the subject disclosed herein is presented. Conventional methods for correcting errors in RS codes utilize a hard-decision decoding method wherein any errors are attempted to be corrected on a sector-by-sector basis. Thus, for a given sector of data (e.g., 512 bytes of data, for example), each RS code symbol should correspond to a coefficient in a polynomial that describes the entire sector. If errors arise, then at least one symbol will not correspond to any coefficient in this polynomial and therefore an error is identified. Conventional methods for dealing this error (as well as additional identified errors) involve using a Berlekamp-Massey algorithm to identify the location of the errors in the sector and a Chien-Forney search engine to correct the identified errors. However, conventional methods do not support using the identifications of the erasures. Various Berlekamp-Massey algorithms are discussed in detail below that are able to take into account erasure information.

Depending on how many errors and erasures there are in a sector, the hard-decision ECC decoding method may be able to correct all errors. That is, for a given ECC block, the size and scope of the Chien-Forney search engine determines how many errors may be corrected. In an example, the number of errors that may be corrected is 20. If more than 20 errors are present, the then hard-decision ECC decoding method may be unable to solve for all errors and other additional decoding methods may then be attempted.

When a codeword is identified as having errors and erasures, the afore-mentioned Berlekamp-Massey algorithm block may attempt to locate the exact position of the errors in the codewords. Erasure locations may be known as the read channel process may flag these positions initially. Then, an erasure-locator polynomial may be generated that describes the identified erasures in the codeword. Together with the actual codeword (which may contain noise-related errors as well), the Berlekamp-Massey algorithm bock may identify the noise-induced error locations and fold in the erasure location to recover the exact locations of all errors and erasures. The location, expressed as a polynomial as well may then be passed to a Chien-Forney search to fix the errors. Details regarding the ECC decoding are discussed in greater detail with respect to FIGS. 1-2.

FIG. 1 is a block diagram of a hard-disk-drive (HDD) system 100 according to an embodiment of the subject matter disclosed herein. Such an HDD system 100 may read data from a hard disk 106 or write data to the hard disk. For the purposes of soft-decision decoding of ECC, only the read operation of the HDD 100 is discussed herein.

Generally speaking, the HDD 100 may include a read channel 109 that may read data from a disk 106 and then pass read data through an ECC block 130 to a buffer manager 150 before eventually being passed along to a host computer (not shown). Each of these components may be controlled by a local HDD controller 105. Further, a skilled artisan will understand that these components (with the exception of the disk 106) may be disposed on a single integrated circuit die, individual integrated circuit dies or any combination of dies thereof. Each of these components is discussed further in the following paragraphs.

When data is to be read from a disk 106, a read head 112 that is part of a front end 110 interprets signals detected on the disk 106 to produce a stream of bits to be sent to a read data path. The front end 110 may include amplification and processing circuitry that assists with reading of data stored on the disk 106. Such circuitry may include pre-amplifier 113, a variable-gain amplifier (VGA) 114, and an analog-to-digital converter (ADC) 115. The read head 112 and pre-amplifier 113 convert the data stored on the disk 106 into an analog read signal, and the VGA 114 adjusts the amplitude of the analog read signal to a predetermined value or range of values deemed suitable for the subsequent components of the read circuit 120. The ADC 115 samples the gain-adjusted analog read signal and converts the analog read signal into a digital read signal that may then be passed to the read circuit 120. As was discussed earlier, noise and inter-symbol interference (ISI) may cause read errors wherein bits of data are affected when being read. Such noise-induced errors may be passed to the read circuit 120.

The read circuit 120 includes several data processing components such as filters and the like (not all are shown) for interpreting the read signal. Generally speaking, data read from the disk 106 may be stored and processed in groupings of eight or ten bits (or other suitable grouping numbers) depending on the RS code being employed. A grouping of bits may be referred to as an ECC symbol wherein a sector of data (comprising 512 bytes of data, for example) may include approximately 410 ECC symbols. These ECC symbols are used for error correction as discussed further below.

The read circuit 120 then interprets signals from the front end 110 on a bit-by-bit basis to reconstruct the symbols of the RS codeword. One component for accomplishing this interpretation is a Viterbi detector 122 that includes a path-history exchange block 121. The Viterbi detector 122 processes the sampled digital read signal to produce a signal comprising a stream of bits having definitive logical values representing "1" or "0". An example of a Viterbi detector that may be the same as or similar to the Viterbi detector 122 is disclosed in U.S. Pat. No. 6,662,338 and U.S. Publication Nos. 2004/0010749 and 2004/0010748, which are incorporated by reference. To help the reader understand the present application better, a brief overview of the operation of the Viterbi detector 122 is presented in the following paragraphs.

A Viterbi detector 122 "recovers" data stored on the disk 106 from the digitalized samples of the read signal generated by the read head 112. Assuming the stored data is binary data, the read head 112 senses one or more bits at a time as the surface of the disk 106 spins, and generates a series of sense voltages that respectively correspond to the sensed bits. This series of sense voltages composes the read signal, which consequently represents these sensed data bits in the order in which the read head 112 sensed them.

Unfortunately, because the disk 106 spins relatively fast with respect to the read head, the read signal is not a clean logic signal having two distinct levels that respectively represent logic 1 and logic 0. Instead, the read signal is laden with noise and ISI, and thus more closely resembles a continuous analog signal than a digital signal. Using a sample clock (not shown), the front end 110 samples the read signal at points that correspond to the read head 112 being aligned with respective bit storage locations on the surface of the disk. The ADC 115 digitizes these samples, and generally, a signal-conditioning block (e.g., the VGA 114 and ADC 118) adjusts the gain and timing of these samples and further equalizes these samples, before passing them to the Viterbi detector 122. The Viterbi detector 122 generates a sequence of bit values that is the most likely interpretation of the sequence of bit values stored on the disk 106.

In determining the output data sequence of the Viterbi detector 122, a dynamic programming detection algorithm (i.e., a Viterbi algorithm) may be used to determine the most probable interpretation of the signals from the front end 110 by passing possible interpretations through various "paths" of a state machine. (Although called a state machine here, those skilled in the art understand that such a reference is made for ease of understanding as the iterations of various dynamic calculations may be software-based and not embodied in any traditional state machine.) As is discussed in greater detail in the aforementioned U.S. Pat. No. 6,662,338, each bit is deterministically calculated by analyzing previous and subsequent bits with respect to the bit being analyzed. Such a calculation determines a "cost" (in term of computational iterations) of determining a logic value of a read bit of data. Thus, the Viterbi algorithm continuously calculates the cost of determining a logical state, and the value of each bit is determined by choosing the least costly path to that bit. The least costly path is the most likely interpretation of the actual bit. It is this most likely determination that is sent to the output of the Viterbi detector 122.

Assuming a noiseless read signal and binary stored data, the read circuit 120 may actually generate digitized read-signal samples having no errors. With such a noiseless environment, the cost of the correct path (correct bit sequence) would be zero, thereby indicating that the likelihood of the correct interpretation is at a maximum. However, as noise and ISI is introduced, different bits may be read incorrectly. In a hard-decision ECC decoding method, only the least costly path (i.e., most likely interpretation) is used for determining the output for each bit.

Further, erasures may still be present and identified by the Viterbi detector 122. The Viterbi detector 122 is able to generate erasure flags to identify bits of data determined to be an erasure. e.g., it is equally likely that a bit is a "1" or "0". Such erasure identification is described in detail in U.S. patent application Ser. No. 12/651,386 entitled "NON-POLYNOMIAL PROCESSING UNIT FOR SOFT-DECISION ERROR CORRECTION CODING" and is herein incorporated by reference. For the purpose herein, the erasure information may be passed to the ECC block 130 for use in the ECC decoding method described below with respect to FIG. 2. After errors are identified and recovered, a corrected codeword may be passed to a buffer manager 140 for additional digital signal processing 150. Aspects of the ECC block 130 and the various ECC methods are described below with respect to FIG. 2.

Figure 2:
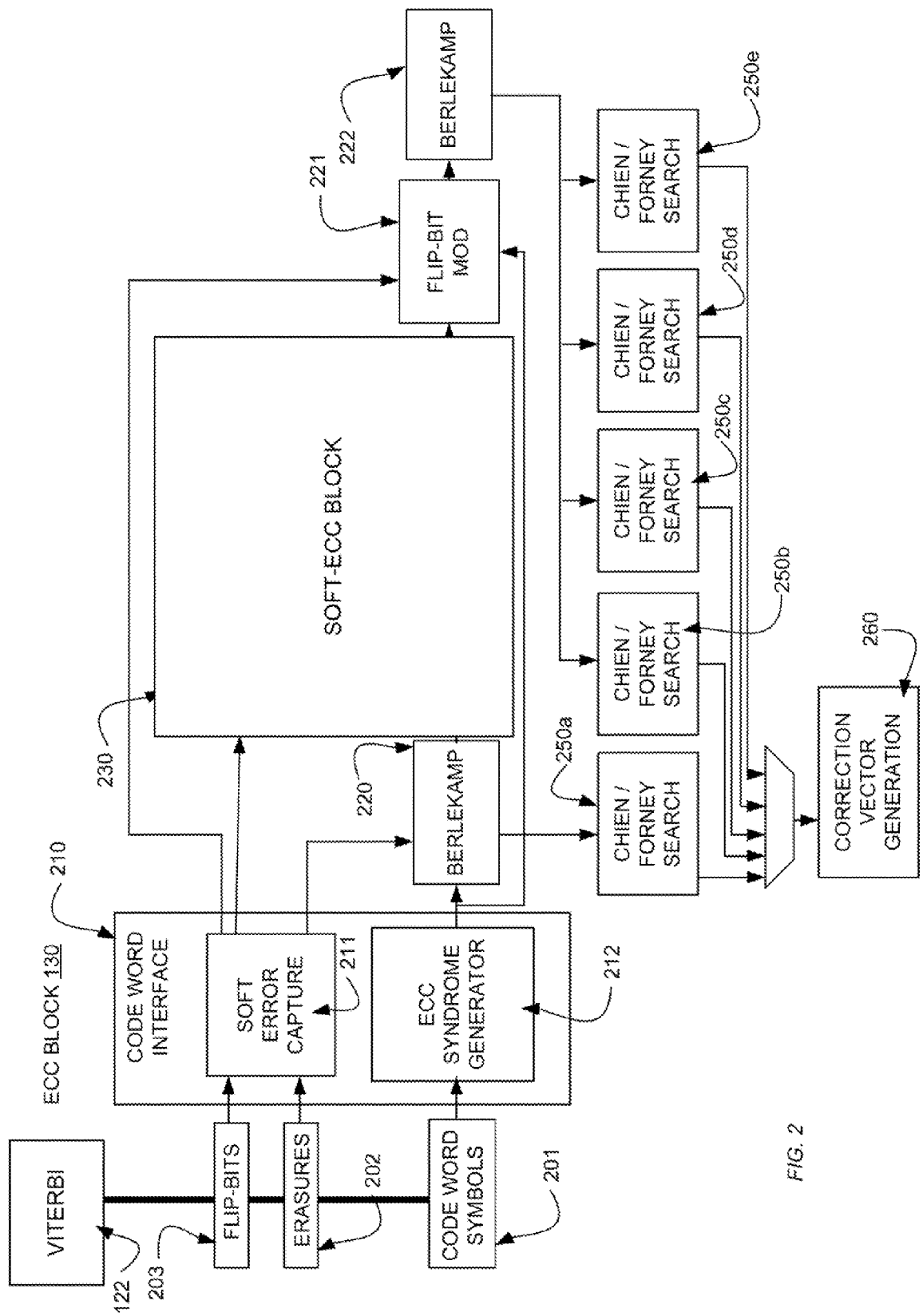
FIG. 2 is a block diagram of an embodiment of an error-code correction block (ECC) that may be part of the controller of FIG. 1.

FIG. 2 is a block diagram of an ECC block 130 according to an embodiment of the subject matter disclosed herein. As before with respect to FIG. 1, only aspects of a read channel and read operation are discussed with respect to FIG. 2. The ECC block 130 may be a functional computing block having program modules for accomplishing the computations and tasks described. Alternatively, aspects of the ECC block 130 may also be hardware-based logic such that computations and tasks are accomplished without use of a processor or by processing instructions. Further, the various components described herein may comprise any combination of hardware or software based modules disposed on one or more integrated circuits.

The ECC block 130 receives data from the read circuit (120 of FIG. 1) in three different manners at a code word interface 210. Depending on the nature of the received data, the code word interface 210 includes different modules for manipulating the data into a format for providing an error-code checking schema. The actual data sequence as interpreted by the hard decisions of the Viterbi detector 122 may be sent in the form of code word symbols 201. Soft data, i.e., the reliability information of the received data is used to identify most likely error events in the detected data sequence. Soft-decision data may be sent to the code word interface 210 in the form of flip-bit identifications 203 and erasure identification 202. The flip-bit identifications 203 may be used in a soft-decision ECC method as discussed related U.S. patent application Ser. No. 12/651,399, entitled "LOW-COMPLEXITY SOFT-DECISION DECODING OF ERROR CORRECTION CODES" and is herein incorporated by reference. The erasure identification 202 may be passed through a soft-error capture block where the location identifications are codified as an erasure-locator polynomial $\lceil(x)$ which may be a first input to a first Berlekamp-Massey block 220.

The code word symbols 201 may be a RS-coded series of bits comprising ten-bit symbols of data within a disk sector as read from the disk. Errors may be checked and corrected on a sector-by-sector when reading data from the disk (106 of FIG. 1). In one embodiment, sectors comprise 512 or 1024 bytes of data. As such, each symbol in the code word symbols 201 may be coded into ten-bit symbols. Different embodiments may use different lengths for symbols, such as an eight-bit length in one other embodiment. Any bit-length for symbols may be used, but for the purposes of this example, a ten-bit symbol is used. Therefore, if one reads one data sector (which may be 512 bytes, for this example), the data sector may have about 410 ten-bit symbols representing the user data in the data sector.

Further, the read channel 109 (FIG. 1) may also have an ECC encoder (not shown) that adds ECC parity symbols to provide error correction capability. In an embodiment, RS encoding used in HDD systems may add a number of parity symbols that is twice the error-correction capability T (e.g., the number of errors the ECC block may handle when only using a hard-decision ECC decoding method) of the ECC block 130. For example, if the error-correction capability T is 20, corresponding to a correction capability of 20 symbols, there will be 40 ECC parity (also called ECC redundancy) symbols. These parity symbols are typically written immediately after the user data in the sector of data. Thus, for T=20, and 410 user data symbols, a total of 450 symbols will be read from the disk for each sector.

After the Viterbi detector sends its hard-decisions on the individual bits read from the disk to the ECC block 130, this 450-symbol grouping of bits may then be used to generate a syndrome at the ECC syndrome generator 212. As syndromes representing a sector of data are computed, syndrome polynomials S(x) are passed to a Berlekamp algorithm block 220 as a second input here.

With the two polynomial inputs (syndrome polynomials S(x) and erasure-locator polynomial $\lceil(x)$) the Berlekamp algorithm block 220 generates an error-locator polynomial σ(x) that is a polynomial which has roots at the error locations (both noise-induced errors and erasures) of the received inputs. As is discussed in greater detail below, there are a number of algorithms that may be used to generate the error-locator polynomial σ(x). In the next paragraphs however, the remainder of the overall method associated with FIG. 2 is discussed.

After the error-locator polynomial σ(x) is generated, the first 250a of five Chien-Forney search engines may be used to find the roots and error magnitude by brute force in a hard-ECC decoding method. Depending on the actual number of errors identified, i.e., the degree of the error-locator polynomial σ(x), the first Chien-Forney search engine may or may not be able to correct the specific errors with the sector. If the number of the errors is less than the error-correction capability T of the ECC block 130, then the Chien-Forney search engine 250a will be able to find and correct all the errors. If the number of errors is greater than error-correction capability T, then this Chien-Forney search engine 250a will not be able to find the roots, and will indicate a decoding failure.

As such, if the degree of the initial error-locator polynomial σ(x) that was generated by the first Berlekamp algorithm block 220 is less than a threshold (e.g., 20 errors for example) for the Chien-Forney search engine 250a, any remaining soft-ECC decoding in a soft-ECC block 230 may not be necessary. However, as the number of erroneous symbols exceeds the error-correction capability T, the hard-decision ECC decoding method fails. Thus, in addition to the hard-decision ECC decoding in this path as just discussed, a soft-decision ECC decoding path may also be employed for attempting to correct symbol errors by methods beyond the hard-decision ECC decoding method.

Briefly, in a soft-decision ECC method, additional reliability information from the Viterbi detector about the detected bits may also be used in the ECC decoding process. The soft-decision ECC method is based on a concept referred to as reliability. Reliability may be a mathematical determination based on a logarithmic likelihood ratio (LLR) as discussed in the aforementioned copending U.S. patent application Ser. No. 12/651,399 entitled "LOW-COMPLEXITY SOFT-DECISION DECODING OF ERROR CORRECTION CODES."

The reliability information from the Viterbi detector 122 may be used to identify and list the least reliable bit locations that correspond to the most likely error events and most likely locations for erasures. This list may be sent to the code word interface 210 as a stream of flip-bit data 203 from the path-history exchange block 121 (FIG. 1) of the Viterbi detector 122. Here, a soft-error capture block 211 passes this information to a soft-ECC block 230 that may be part of the overall ECC block 130. The soft-ECC block 230 may then use this list to iteratively attempt to correct errors using the initial (hard-decision) error-locator polynomial of the first Berlekamp algorithm block 220. As the soft-ECC block identifies potential error correction polynomials, additional hard-decision ECC decoding may be attempted using a second Berlekamp-Massey algorithm block 222 and additional Chien-Forney search engines 250b-250e. If any on method succeeds in correcting all sector errors, a correction vector 260 is generated and all other process are halted. The second Berlekamp-Massey algorithm block 222 may also use erasure information in determining its error-locator polynomial.

Turning back to the algorithms of the Berlekamp-Massey algorithm block 220 (and 222), erasure information may be identified as a series of positions denoted by $j_1, j_2, \ldots, j_{2t}$. In an embodiment, up to 32 erasures may be handled in a single sector. Further, the symbols identified as erasures may be passed along as part of the codeword to the ECC block without any additional manipulation. That is, some methods may zero out the symbols known to be incorrect. However, in this embodiment, simply the identification of a symbol as an erasure is sufficient to recover the erasure through the described ECC method. As such, syndromes noting erasure information calculated may then be denoted as:

$$S_j = r_0 + r_1 a^j + r_2 a^{2j} + \ldots + r_{n-1} a^{(n-1)j}$$

Then an erasure-locator polynomial may be generated as:

$$\lceil(x) = \Pi(1 + a^{j_m} x) \text{ for } m = 1 \text{ to } s$$

Several mathematical methods may be used to determine an error-locator polynomial for a given set of syndromes. Five such methods are 1) a Forney algorithm approach, 2) a Blahut algorithm approach, 3) an inversionless Forney algorithm approach, 4) an inversionless Blahut algorithm approach, and 5) a dual-line inversionless Blahut algorithm approach. These are discussed and shown in the following paragraphs.

A first method involves a Forney algorithm approach, wherein one may fold the set of 2t syndromes $S_1, S_2, \ldots, S_{2t}$ into 2t-s modified syndromes $\equiv_{s+1}, \equiv_{s+2}, \ldots, \equiv_{2t}$, as modified by the erasure locator polynomial $\lceil(x)$. The resulting polynomial is a modified error-locator polynomial $\Lambda(x)$ which may be used to determine an errata-locator polynomial $\Omega(x)$ indicative of all errors and erasures in a sector.

Then the key equation:

$$[1 + S(x)]\lceil(x)\Lambda(x) = \Omega(x) \bmod x^{2t+1}$$

may be viewed in the form:

$$[1 + \equiv(x)]\Lambda(x) = \Omega(x) \bmod x^{2t+1}$$

Therefore, the modified syndromes may be:

$$1 + \equiv_1 x + \ldots + \equiv_{2t} x^{2t} = (1 + S_1 x + \ldots + S_{2t} x^{2t})(1 + \lceil_1 x + \ldots + \lceil_{2t} x^{2t}) \bmod x^{2t+1}$$

and the last 2t-s modified syndromes may be fed to the Berlekamp-Massey algorithm block 220 to determine a modified error-locator polynomial $\Lambda(x)$. However, the generation of such a modified error-locator polynomial $\Lambda(x)$ requires the pre-calculation of the modified syndromes which requires additional hardware and computational effort.

In the second approach, the Blahut algorithm does not generate modified syndromes; rather in this approach, 2t regular syndromes are fed directly to the Berlekamp-Massey algorithm block 220. Thus, the error-locator polynomial $\sigma(x)$ may be defined as:

$$\sigma(x) = \Lambda(x)\lceil(x)$$

This approach reduces decoder latency in that the polynomial multiplications before and after the Berlekamp-Massey algorithm are avoided. Therefore, the Blahut algorithm may be summarized as follows:

$$\Lambda^{(s)}(x) = \Gamma(x), T^{(s)}(x) = \Gamma(x), L_s = s \text{ for } (i = s+1; i \leq 2t; i++)$$
$$\{ \Delta_i = \Sigma \Lambda_k^{(i-1)} S_{(i-1)} \text{ from } k = 0 \text{ to } L_{i-1}$$
$$\Lambda^{(i)}(x) = \Lambda^{(i-1)}(x) + \Delta_i x T^{(i-1)}(x)$$
$$\text{if } \Delta_I \neq 0 \text{ and } 2L_{i-1} \leq i-1+s, \text{ then}$$
$$\quad L_i = i - L_{i-1} + S \text{ and } T^{(i)}(x) = \Delta_i^{-1} \Lambda^{(i-1)}(x)$$
$$\text{else}$$
$$\quad L_i = L_{i-1} \text{ and } T^{(i)}(x) = xT^{(i-1)}(x) \}$$

Another approach is to use an inversionless Forney algorithm as follows:

$$\Lambda^{(0)}(x) = 1, B^{(0)}(x) = 1, L_0 = 0 \text{ for } (i = 1; i \leq 2t-s; i++)$$
$$\{ \Delta_i = \Sigma \Lambda_k^{(i-1)} \equiv_{(i-k+s)} \text{ from } k = 0 \text{ to } L_{i-1}$$
$$\Lambda^{(i)}(x) = \epsilon^{(i-1)}\Lambda^{(i-1)}(x) + \Delta_i x B^{(i-1)}(x)$$
$$\text{if } \Delta_I \neq 0 \text{ and } 2L_{i-1} \leq i-1, \text{ then}$$
$$\quad L_i = i - L_{i-1} \text{ and } \epsilon^{(i)} = \Delta_i \text{ and } B^{(i)}(x) = \Lambda^{(i-1)}(x)$$
$$\text{else}$$
$$\quad L_i = L_{i-1} \text{ and } \epsilon^{(i)} = \epsilon^{(i-1)} \text{ and } B^{(i)}(x) = B^{(i-1)}(x) \}$$

Further yet, another approach is to use an inversionless Blahut algorithm as follows:

$$\sigma^{(s)}(x) = \Gamma(x), B^{(0)}(x) = \Gamma(x), L_0 = s \text{ for } (i = s+1; i \leq 2t; i++)$$
$$\{ \Delta_i = \Sigma \Lambda_k^{(i-1)} \equiv_{(i-k+s)} \text{ from } k = 0 \text{ to } L_{i-1}$$
$$\Lambda^{(i)}(x) = \epsilon^{(i-1)}\Lambda^{(i-1)}(x) + \Delta_i x B^{(i-1)}(x)$$
$$\text{if } \Delta_I \neq 0 \text{ and } 2L_{i-1} \leq s+i-1, \text{ then}$$
$$\quad L_i = i - L_{i-1} - s \text{ and } \epsilon^{(i)} = \Delta_i \text{ and } B^{(i)}(x) = \Lambda^{(i-1)}(x)$$
$$\text{else}$$
$$\quad L_i = L_{i-1} \text{ and } \epsilon^{(i)} = \epsilon^{(i-1)} \text{ and } B^{(i)}(x) = B^{(i-1)}(x) \}$$

Lastly, in these example approaches, a dual-line inversionless Blahut algorithm may be realized. The algorithm may be initialized by the following partial metrics:

$$C_k^{(s)} = \Sigma \Gamma_i S_{(2t-s)+1+k} \text{ from } i = 0 \text{ to } s \quad \text{for } k = 0, \ldots, 2t-s-1$$
$$C_k^{(s)} = \Gamma_{i-(2t-s)+1+k} \quad \text{for } k = 2t-s, \ldots, 2t$$
$$D_k^{(s)} = C_{k-1}^{(s)} \quad \text{for } k = 0, \ldots, 2t+1 \text{ and } k \neq 2t-s$$
$$D_k^{(s)} = 0 \quad \text{for } k = 2t-s$$

Then the dual-line inversionless Blahut algorithm is summarized as:

$$L_s = s, \epsilon^{(s)} = 1 \text{ for } (i = s+1; i \leq 2t; i++)$$
$$\{ \Delta_i = C_0^{(i-1)}$$
$$\quad \text{for } (k = 0; k \leq 2t; k++)$$
$$\quad\quad C_k^{(i)} = \epsilon^{(i-1)} C_{k+1}^{(i-1)} + \Delta_i D_{k+1}^{(i-1)}$$
$$\quad\quad C_{2t}^{(i)} = \Delta_i D_{2t+1}^{(i-1)}$$
$$\text{if } \Delta_I \neq 0 \text{ and } 2L_{i-1} \leq i-1+s, \text{ then}$$
$$\quad L_i = i - L_{i-1} + s \text{ and } \epsilon^{(i)} = \Delta_i$$
$$\quad \text{for } (k = 1; k \leq 2t; k++)$$
$$\quad\quad D_k^{(i)} = (k==2t-i) ? 0 : C_k^{(i-1)}$$
$$\quad\quad D_{2t+1}^{(i)} = 0$$
$$\text{else}$$
$$\quad L_i = L_{i-1} \text{ and } \epsilon^{(i)} = \epsilon^{(i-1)}$$
$$\quad \text{for } (k = 1; k \leq 2t; k++)$$
$$\quad\quad D_k^{(i)} = (k==2t-i) ? 0 : D_k^{(i-1)}$$
$$\quad\quad D_{2t+1}^{(i)} = 0 \}$$

To further illustrate the differences and advantages of various algorithms as discussed above, a simple example is shown for each of the algorithms. In this example, the codeword is a Reed Solomon code over Galois Field ($2^3$) with a generator polynomial g(x):

$$g(x) = \Pi(x + a^i) \text{ for } i = 1 \text{ to } 4 = = \alpha^3 + \alpha x + x^2 + \alpha^3 x^3 + x^4$$

At the front end 110 (FIG. 1) data may initially be encoded as a message polynomial m(x):

$$m(x) = \alpha^5 + \alpha^4 x + x^2$$

into the systematic codeword c(x) that describes the data as should be read from the medium:

$$c(x) = \alpha^4 + x^3 + \alpha^5 x^4 + \alpha^4 x^5 + x^4$$

However, the read channel may corrupts the codeword c(x) by the error polynomial e(x):

$$e(x) = \alpha^2 x + \alpha^6 x^2 + \alpha x^5$$

into the received noisy codeword r(x):

$$r(x) = \alpha^4 + \alpha^2 x + \alpha^6 x^2 + x^3 + \alpha^5 x^4 + \alpha^2 x^5 + x^6$$

In this example, the Viterbi detector 122 may tag two symbols (e.g., symbols one a five) as being erasures. Assuming the tagging is correct and these symbols are actually erasures, then the erasure locator polynomial $\Gamma(x)$ is:

$$\Gamma(x) = (1 + \alpha^1 x)(1 + \alpha^5 x) = 1 + \alpha^6 x + \alpha^6 x^2$$

The syndromes $S_1$-$S_4$ are also computed for received codeword (having errors and erasures):

$$S_1 = r(\alpha^1) = \alpha^2 \ S_2 = r(\alpha^2) = \alpha^3 \ S_3 = r(\alpha^3) = \alpha^2 \ S_4 = r(\alpha^4) = \alpha^6$$

Then, the syndrome polynomial S(x) is:

$$1 + S(x) = 1 + \alpha^2 x + \alpha^3 x^2 + \alpha^2 x^3 + \alpha^6 x^4$$

Working through each algorithm described above, the first approach uses the Forney algorithm. A modified syndrome polynomial $\equiv(x)$ may be computed as:

$$1 + \equiv(x) = [1 + S(x)]\Gamma(x) = 1 + x + \alpha^2 x^2 + \alpha x^3 \alpha^3 x^4$$

Then implement the Berlekamp-Massey algorithm on the last 2t-s modified syndromes with the initialization of:

---

$\Lambda^{(0)}(x) = 1 \quad T^{(0)}(x) = 1 \quad L_0 = 0$
  for i=1
$\Delta_1 = \equiv_3 = \alpha \ \Lambda^{(1)}(x) = \Lambda^{(0)}(x) + \Delta_1 x T^{(0)}(x) = 1 + \alpha x$
$2L_1 < i$ then length change $\quad L_1 = 1 \quad T^1(x) = \Delta_1^{-1}, \Lambda^{(0)}(x) = \alpha^6$
  For i=2
$\Delta_2 = \equiv_4 + \Lambda_1^{\ 1} \equiv_3 = \alpha^5 \ \Lambda^{(2)}(x) = \Lambda^{(1)}(x) + \Delta_2 x T^{(1)}(x) = 1 + \alpha^2 x$
$2L_1 \geq i$ then no length change $\quad L_2 = 1 \quad T^2(x) = xT^{(1)}(x) = \alpha^6 x$

---

It can be seen that the Berlekamp-Massey algorithm has correctly identified that an error is in position 2. Given the error locator $\Lambda(x)$ and erasure locator $\Gamma(x)$ polynomials we compute the errata locator polynomial $\psi(x)$:

$$\psi(x) = \Gamma(x)\Lambda(x) = (1 + \alpha^6 + \alpha^6 x^2)(1 + \alpha^2 x) = 1 + x + \alpha^5 x^2 + \alpha x^3$$

The formal derivative $\psi'(x)$ of the errata locator polynomial is:

$$\psi'(x) = 1 + \alpha^2 x$$

The errata evaluator polynomial $\Omega(x)$ may then be determined:

$$\Omega(x) = [1 + S(x)]\psi(x) \bmod x^{2t+1} = 1 + \alpha^6 x + \alpha^2 x^3$$

And the errata magnitudes may be computed:

$$e_1 = a^1 \frac{\Omega(a^{-1})}{\psi'(a^{-1})} = a^2 \quad e_2 = a^2 \frac{\Omega(a^{-2})}{\psi'(a^{-2})} = a^6 \quad e_5 = a^5 \frac{\Omega(a^{-5})}{\psi'(a^{-5})} = a$$

Finally the errata magnitudes are added to the received codeword (with errors and erasures) to recover the (estimate of the) original codeword $\hat{c}(x)$:

$$\hat{c}(x) = r(x) + e(x)$$
$$= (a^4 + a^2 x + a^6 x^2 + x^3 + a^5 x^4 + a^2 x^5 + x^6) + (a^2 x + a^6 x^2 + ax^5)$$
$$= a^4 + x^3 + a^5 x^4 + a^4 x^5 + x^6$$

A second approach example uses the Blahut algorithm. Again, the erasure locator $\Gamma(x)$ and syndrome polynomials S(x) are used to begin:

$$\Gamma(x) = (1 + \alpha^1 x)(1 + \alpha^5 x) = 1 + \alpha^6 x + \alpha^6 x^2$$

$$1 + S(x) = 1 + \alpha^2 x + \alpha^3 x^2 + \alpha^2 x^3 + \alpha^6 x^4$$

Then implement the Berlekamp-Massey algorithm on the last 2t-s modified syndromes with the initialization of:

---

$\Lambda^{(2)}(x) = \Gamma(x) = 1 + \alpha^6 x + \alpha^6 x^2 \quad T^{(2)}(x) = \Gamma(x) = 1 + \alpha^6 x + \alpha^6 x^2$
$L_2 = s = 2$
  for i=3
$\Delta_3 = S_3 + \Lambda_1^{(2)} S_2 + \Lambda_2^{(2)} S_1 = \alpha$
$L_2 < i - L_2 + s$ then length change
$L_3 = i - L_2 + s = 3$
$\Lambda^{(3)}(x) = \Lambda^{(2)}(x) + \Delta_3 x T^{(2)}(x) = 1 + x + \alpha^5 x^2 + \alpha x^2$
$T^{(3)}(x) = \Delta_3^{-1} \Lambda^{(2)}(x) = \alpha^6 + \alpha^5 x + \alpha^2 x^3$
  for i = 4
$\Delta_4 = S_4 + \Lambda_1^{(3)} S_3 + \Lambda_2^{(3)} S_2 + \Lambda_3^{(3)} S_1 = \alpha^5$
$L_3 \geq i - L_3 + s$ then no length change
$L_4 = L_3 = 3$
$\Lambda^{(4)}(x) = \Lambda^{(3)}(x) + \Delta_4 x T^{(3)}(x) = 1 + x + \alpha^5 x^2 + \alpha x^3$
$T^{(4)}(x) = xT^{(3)}(x) = \alpha^6 x + \alpha^5 x^2 + \alpha^2 x^3$

---

The errata locator polynomial is $\psi(x)$:

$$\psi(x) = \Lambda^{(4)}(x) = 1 + x + \alpha^5 x^2 + \alpha x^3$$

The errata positions correspond to the roots:

$$\psi(\alpha^{-2}) = \psi(\alpha^{-2}) = \psi(\alpha^{-5}) = 0$$

Similar to the Forney example, the errata magnitudes are evaluated and the original codeword is recovered.

$$e_1 = a^1 \frac{\Omega(a^{-1})}{\psi'(a^{-1})} = a^2 \quad e_2 = a^2 \frac{\Omega(a^{-2})}{\psi'(a^{-2})} = a^6 \quad e_5 = a^5 \frac{\Omega(a^{-5})}{\psi'(a^{-5})} = a$$

$$\hat{c}(x) = r(x) + e(x)$$
$$= (a^4 + a^2 x + a^6 x^2 + x^3 + a^5 x^4 + a^2 x^5 + x^6) + (a^2 x + a^6 x^2 + ax^5)$$
$$= a^4 + x^3 + a^5 x^4 + a^4 x^5 + x^6$$

The third approach uses an Inversionless Forney algorithm as is detailed within the same example as follows. Here, the modified syndrome polynomial $\equiv(x)$ is initially used:

$$1 + \equiv(x) = [1 + S(x)]\Gamma(x) = 1 + x + \alpha^2 x^2 + \alpha x^3 \alpha^3 x^4$$

Then implement the Berlekamp-Massey algorithm on the last 2t-s modified syndromes with the initialization of:

---

$\Lambda^{(0)}(x) = 1, B^{(0)}(x) = 1, L_0 = 0, \epsilon^{(0)} = 1$
  for i=1
$\Delta_1 = \equiv_3 = \alpha$
if $L_0 < i - L_0$ then length change
  $L_1 = i - L_0 = 1$
  $\epsilon^{(1)} = \Delta_1 = \alpha$
$\Lambda^{(1)}(x) = \epsilon^{(0)}\Lambda^{(0)}(x) + \Delta_1 x B^{(0)}(x) = 1 + \alpha x$
$B^{(1)}(x) = \Lambda^{(0)}(x) = 1$
  for i = 2
$\Delta_2 = \equiv_4 + \Lambda_1^{(1)} \equiv_3 = \alpha^5$
if $L_0 \geq i - L_1$ then no length change
  $L_2 = L_1 = 1$
  $\epsilon^{(2)} = \epsilon^{(1)} = \alpha$
$\Lambda^{(2)}(x) = \epsilon^{(1)}\Lambda^{(1)}(x) + \Delta_2 x B^{(1)}(x) = \alpha + \alpha^3 x$
$B^{(2)}(x) = xB^{(1)}(x) = x$

---

Although this polynomial is not monic, the roots are the same as the earlier Forney example. One may allow for an arbitrary scalar factor in the error locator, as it will drop out later when evaluating the errata magnitudes. The errata locator polynomial $\psi(x)$ is:

$$\psi(x)=\lceil(x)\Lambda(x)=(\alpha+\alpha^3x)(1+\alpha^6x\,\alpha^6x^2)=\alpha+\alpha x+\alpha^6x^2+\alpha^2x^3$$

The errata positions correspond to the roots:

$$\psi(\alpha^{-2})=\psi(\alpha^{-2})=\psi(\alpha^{-5})=0$$

Then compute the errata evaluator polynomial $\Omega(x)$:

$$\Omega(x)=[1+\equiv(x)]\Lambda(x)\bmod x^{2t+1}=\alpha+x+\alpha^3x^3$$

the errata magnitudes:

$$e_1 = a^1 \frac{\Omega(a^{-1})}{\psi'(a^{-1})} = a^2 \quad e_2 = a^2 \frac{\Omega(a^{-2})}{\psi'(a^{-2})} = a^6 \quad e_5 = a^5 \frac{\Omega(a^{-5})}{\psi'(a^{-5})} = a$$

and then recover the original codeword:

$$\hat{c}(x)=r(x)+e(x)=\alpha^4+x^3+\alpha^5x^4+\alpha^4x^5+x^6$$

The fourth example approach involves an Inversionless Blahut algorithm where the same erasure locator $\lceil(x)$ and syndrome polynomials $S(x)$ are used to begin:

$$\lceil(x)=(1+\alpha^1x)(1+\alpha^5x)=1+\alpha^6x+\alpha^6x^2$$

$$1+S(x)=1+\alpha^2x+\alpha^3x^2+\alpha^2x^3+\alpha^6x^4$$

Then implement the Berlekamp-Massey algorithm on the last 2t-s modified syndromes with the initialization of:

---

$\Lambda^{(2)}(x) = \Gamma(x) = 1 + \alpha^6x + \alpha^6x^2$  $B^{(2)}(x) = \Gamma(x) = 1 + \alpha^6x + \alpha^6x^2$
$L_2 = 2$  $\epsilon^{(2)} = 1$
 for i=3
$\Delta_3 = S_3 + \Lambda_1^{(2)}S_2 + \Lambda_2^{(2)}S_1 = \alpha$
$L_2 < i - L_2 + s$ then length change
  $L_3 = i - L_2 + s = 3$
  $\epsilon^{(2)} = \Delta_3 = \alpha$
$\Lambda^{(3)}(x) = \epsilon^{(2)}\Lambda^{(2)}(x) + \Delta_3xB^{(2)}(x) = 1 + \alpha^5x + \alpha^2x^2 + x^3$
$B^{(3)}(x) = \Lambda^{(2)}(x) = 1 + \alpha^6x + \alpha^6x^2$
 for i = 4
$\Delta_4 = S_4 + \Lambda_1^{(3)}S_3 + \Lambda_2^{(3)}S_2 + \Lambda_3^{(3)}S_1 = \alpha^5$
$L_3 \geq i - L_3 + s$ then no length change
  $L_4 = L_3 = 3$
  $\epsilon^{(4)} = \epsilon^{(3)} = \alpha$
$\Lambda^{(4)}(x) = \epsilon^{(3)}\Lambda^{(3)}(x) + \Delta_4xB^{(3)}(x) = \alpha + \alpha x + \alpha^6x^2 + \alpha^3x^3$
$B^{(4)}(x) = xB^{(3)}(x) = x + \alpha^6x^2 + \alpha^6x^3$

---

The errata locator polynomial $\psi(x)$ is:

$$\psi(x)=\Lambda^{(4)}(x)=\alpha+\alpha x+\alpha^6x^2+\alpha^3x^3$$

Although this polynomial is not monic, the roots are the same as the earlier Blahut example. We can allow an arbitrary scalar factor in the errata locator polynomial $\psi(x)$, as it will drop out later when we evaluate the errata magnitudes. Thus, the errata evaluator polynomial $\Omega(x)$ is computed:

$$\Omega(x)=[1+S(x)]\psi(x)\bmod x^{2t+1}=\alpha+x+\alpha^3x^3$$

yielding the errata magnitudes:

$$e_1 = \alpha^1 \frac{\Omega(\alpha^{-1})}{\Psi'(\alpha^{-1})} = \alpha^2$$

$$e_2 = \alpha^2 \frac{\Omega(\alpha^{-2})}{\Psi'(\alpha^{-2})} = \alpha^6$$

$$e_5 = \alpha^5 \frac{\Omega(\alpha^{-5})}{\Psi'(\alpha^{-5})} = \alpha$$

Similar to the previous examples one may correctly recover the original codeword:

$$\hat{c}(x)=r(x)+e(x)=\alpha^4+x^3+\alpha^5x^4+\alpha^4x^5+x^6$$

Finally, the fifth approach corresponds to using an Inversionless Blahut Dual Line algorithm. The erasure locator $\lceil(x)$ and syndrome polynomials $S(x)$ are as before:

$$\lceil(x)=(1+\alpha^1x)(1+\alpha^5x)=1+\alpha^6x+\alpha^6x^2$$

$$1+S(x)=1+\alpha^2x+\alpha^3x^2+\alpha^2x^3+\alpha^6x^4$$

Then implement the Berlekamp-Massey algorithm on the last 2t-s modified syndromes with the initialization of:

---

$L_2 = 2$  $\epsilon^{(2)} = \alpha$
$C_0^{(2)} = \Gamma_0S_3 + \Gamma_1S_2 + \Gamma_2S_1 = \alpha$
$C_1^{(2)} = \Gamma_0S_4 + \Gamma_1S_3 + \Gamma_2S_2 = \alpha^3$
$C_2^{(2)} = \Gamma_0 = 1$
$C_3^{(2)} = \Gamma_1 = \alpha^6$
$C_4^{(2)} = \Gamma_2 = \alpha^6$
$D_1^{(2)} = \Gamma_0S_3 + \Gamma_1S_2 + \Gamma_2S_1 = \alpha$
$D_2^{(2)} = 0$
$D_3^{(2)} = \Gamma_0 = 1$
$D_4^{(2)} = \Gamma_1 = \alpha^6$
$D_5^{(2)} = \Gamma_2 = \alpha^6$
 for i = 3
$L_2 < i - L_2 + s$ then length change  $L_3 = i - L_2 + s$  $\epsilon^{(2)} = \Delta_3 = \alpha$
$C_0^{(3)} = \epsilon^{(2)}C_1^{(2)} + \Delta_3D_1^{(2)} = \alpha^5$
$C_1^{(3)} = \epsilon^{(2)}C_2^{(2)} + \Delta_3D_2^{(2)} = 1$
$C_2^{(3)} = \epsilon^{(2)}C_3^{(2)} + \Delta_3D_3^{(2)} = \alpha^5$
$C_3^{(3)} = \epsilon^{(2)}C_4^{(2)} + \Delta_3D_4^{(2)} = \alpha^2$
$C_4^{(3)} = \Delta_3D_5^{(2)} = 1$
$D_1^{(3)} = 0$
$D_2^{(3)} = C_2^{(2)} = 1$
$D_3^{(3)} = C_3^{(2)} = \alpha^6$
$D_4^{(3)} = C_4^{(2)} = \alpha^6$
$D_5^{(3)} = 0$
 for i = 4
$L_3 \geq i - L_3 + s$ then no length change $L_4 = L_3 = 3$ $\epsilon^{(4)} = \epsilon^{(3)} = \alpha$
$C_0^{(4)} = \epsilon^{(3)}C_1^{(3)} + \Delta_4D_1^{(3)} = \alpha^5$
$C_1^{(4)} = \epsilon^{(3)}C_2^{(3)} + \Delta_4D_2^{(3)} = 1$
$C_2^{(4)} = \epsilon^{(3)}C_3^{(3)} + \Delta_4D_3^{(3)} = \alpha^5$
$C_3^{(4)} = \epsilon^{(3)}C_4^{(3)} + \Delta_4D_4^{(3)} = \alpha^2$
$C_4^{(4)} = \Delta_4D_5^{(3)} = 1$
$D_1^{(4)} = D_1^{(3)} = 0$
$D_2^{(4)} = D_1^{(3)} = 1$
$D_3^{(4)} = D_1^{(3)} = \alpha^6$
$D_4^{(4)} = D_1^{(3)} = \alpha^6$
$D_5^{(4)} = 0$

---

The errata locator polynomial $\psi(x)$ is:

$$\psi(x)=C^{(4)}(x)=\alpha+\alpha x+\alpha^6x^2+\alpha^3x^3$$

This is the same errata locator polynomial as in the inversionless Blahut example. Thus, this algorithm recovers the original codeword in a similar fashion as shown before but does so by using a simpler mathematical approach. Therefore, computational time and effort savings are realized.

Figure 3:
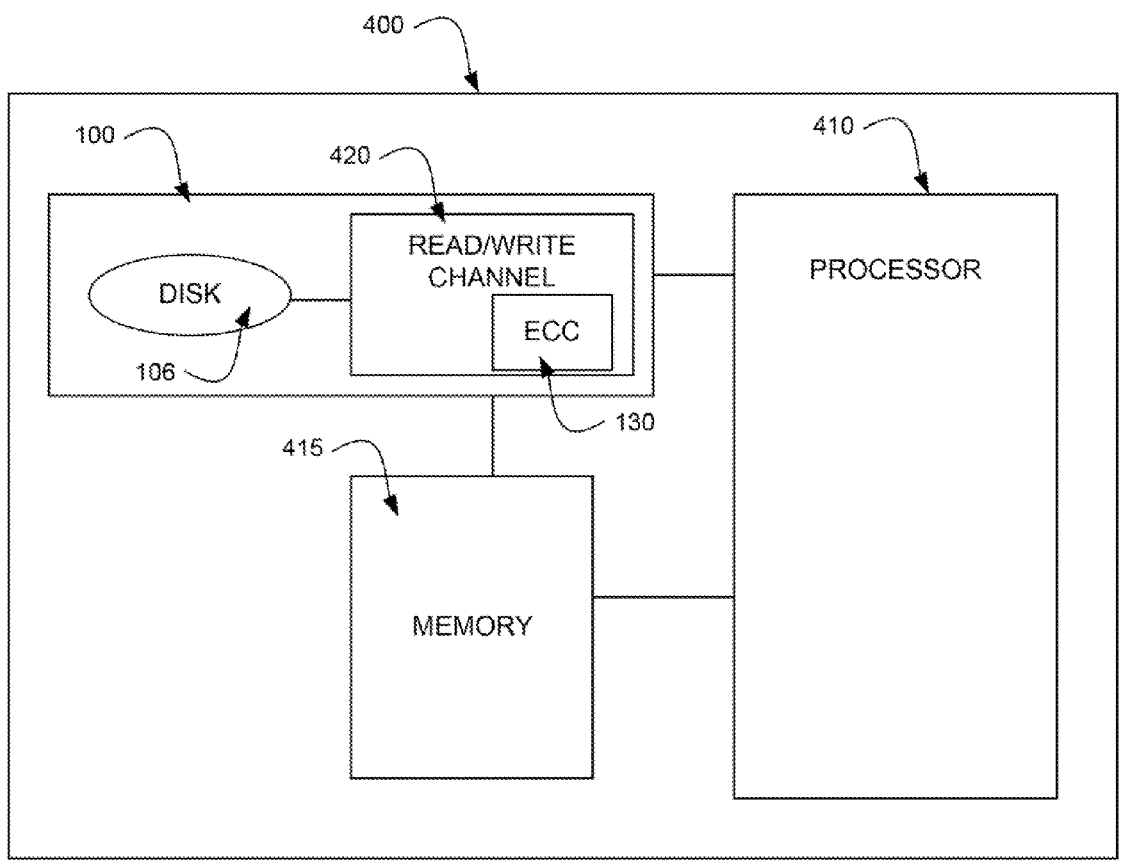
FIG. 3 is a block diagram of an embodiment of a computer system that may implement the HDD of FIG. 1 and the ECC block of FIG. 2.

FIG. 3 is a block diagram of an embodiment of a computer system 400 that may implement the HDD system 100 of FIG. 1 and the ECC block 130 of FIG. 2. In this system embodiment, the system 400 may include a processor 410 coupled to a local memory 415 and coupled to the HDD system 100. As can be seen, the HDD system 100 includes a hard disk 106 and a read/write channel 420 having an ECC bock 130. The processor 410 may be operable to control the memory 415 and the HDD system 100 in transferring data to and from the disk 106 and to and from the memory 415. Further, additional data stores and communication channels (not shown) may be used to transfer data to and from the HDD system 100 that may be remote from this computer system 400.

Such a computer system may be any number of devices including a CD player, a DVD player, a Blu-Ray player, a personal computer, a server computer, a smart phone, a wireless personal device, a personal audio player, media storage and delivery system or any other system that may read and write data to and from a storage medium or communication channel.

While the subject matter discussed herein is susceptible to various modifications and alternative constructions, certain illustrated embodiments thereof are shown in the drawings and have been described above in detail. It should be understood, however, that there is no intention to limit the claims to the specific forms disclosed, but on the contrary, the intention is to cover all modifications, alternative constructions, and equivalents falling within the spirit and scope of the claims.

What is claimed is:

1. A code error-locating module, comprising:
a first input configured to receive a polynomial indicative of a stream of bits, the stream of bits including at least one error and at least one erasure;
a second input configured to receive a polynomial indicative of erasure information about the stream of bits; and
a first output configured to generate a polynomial indicative of the location of the at least one error and the at least one erasure and coupled to an algebraic decoding module; and
a second output configured to generate a polynomial indicative of the location of the at least one error and the at least one erasure and coupled to an inferential decoding module.

2. The module of claim 1, further comprising a non-polynomial processing unit configured to generate polynomials from bits of data received at the first and second inputs.

3. The non-polynomial processing unit of claim 2, further comprising a decision module configured to determine if a determined degree corresponding to a number of errors is less than a pre-determined error-correction capacity and if so, configured to forward data about at least one error to a search module.

4. An code error-locating module, comprising:
a first input configured to receive a polynomial indicative of a stream of bits, the stream of bits including at least one error and at least one erasure;
a second input configured to receive a polynomial indicative of erasure information about the stream of bits; and
an output configured to generate a polynomial indicative of the location of the at least one error and the at least one erasure;
wherein the output is coupled to a computational block that generates the polynomial using an Inversionless Blahut Dual Line algorithm.

5. The module of claim 4 wherein the Inversionless Blahut Dual Line algorithm comprises:
an erasure polynomial
and a syndrome polynomial such that an errata locator polynomial results.

6. The module of claim 4 wherein the computational block is further configured to determine a number of errors in the stream of data based upon a determining a difference between a first finite field and a second finite field, each finite field defined by the soft-decision data.

7. An code error-locating module, comprising:
a first input configured to receive a polynomial indicative of a stream of bits, the stream of bits including at least one error and at least one erasure;
a second input configured to receive a polynomial indicative of erasure information about the stream of bits; and
an output configured to generate a polynomial indicative of the location of the at least one error and the at least one erasure;

further comprising a non-polynomial processing unit configured to generate polynomials from bits of data received at the first and second inputs; wherein the polynomials comprise an error-locator polynomial, an auxiliary polynomial and a gradient polynomial derived from a sector of data coded is a Reed-Solomon code.

8. A controller, comprising:
a read channel configured to receive read data from a stream of bits, including:
a first input configured to receive a polynomial indicative of the stream of bits, the stream of bits including at least one error and at least one erasure;
a second input configured to receive a polynomial indicative of erasure information about the stream of bits; and
a first output configured to generate a polynomial indicative of the location of the at least one error and the at least one erasure and coupled to an algebraic decoding module; and
a second output configured to generate a polynomial indicative of the location of the at least one error and the at least one erasure and coupled to an inferential decoding module.

9. The controller of claim 8 further comprising an integrated circuit disposed on a single die.

10. The controller of claim 8 further comprising at least two integrated circuits disposed on a separate integrated circuit dies and communicatively coupled to each other.

11. A controller, comprising:
a read channel configured to receive read data from a stream of bits, including:
a first input configured to receive a polynomial indicative of the stream of bits, the stream of bits including at least one error and at least one erasure;
a second input configured to receive a polynomial indicative of erasure information about the stream of bits; and
an output configured to generate a polynomial indicative of the location of the at least one error and the at least one erasure;
the controller further comprising a Berlekamp Massey algorithm block coupled to the output and configured to generate the polynomial using one of the calculations comprising: a Forney algorithm approach, a Blahut algorithm approach, an inversionless Forney algorithm approach, an inversionless Blahut algorithm approach, and a dual-line inversionless Blahut algorithm approach.

12. The controller of claim 11, further comprising a second Berlekamp Massey algorithm block coupled to the output and configured to generate a modified polynomial with error corrections received from an error-correction block.

13. The controller of claim 12, further comprising a Chien-Forney search block coupled to the second Berlekamp Massey algorithm block configured to correct all identified errors and erasures in the bit stream.

14. The controller of claim 12, further comprising a plurality of Chien-Forney search blocks coupled in parallel to the second Berlekamp Massey algorithm block, each configured to collectively correct all identified errors and erasures in the bit stream.

15. A hard-disk drive system, comprising:
a storage medium;
a read head configured to read data from the storage medium; and
a read channel coupled to the read head having an error-code correction module including:

a first input configured to receive a polynomial indicative of the stream of bits, the stream of bits including at least one error and at least one erasure;

a second input configured to receive a polynomial indicative of erasure information about the stream of bits; and a first output configured to generate a polynomial indicative of the location of the at least one error and the at least one erasure and coupled to an algebraic decoding module; and a second output configured to generate a polynomial indicative of the location of the at least one error and the at least one erasure and coupled to an inferential decoding module.

16. The hard-disk drive system of claim 15, further comprising a controller coupled to the storage medium, the read head and the read channel, the controller configured to control the operations of the hard-disk drive system.

17. A receiver, comprising:
a receiving channel;
a read channel queue configured to receive data from the receiving channel; and
a read channel coupled to the read channel queue having an error-code correction module including:
a first input configured to receive a polynomial indicative of the stream of bits, the stream of bits including at least one error and at least one erasure;
a second input configured to receive a polynomial indicative of erasure information about the stream of bits; and
a first output configured to generate a polynomial indicative of the location of the at least one error and the at least one erasure and coupled to an algebraic decoding module; and
a second output configured to generate a polynomial indicative of the location of the at least one error and the at least one erasure and coupled to an inferential decoding module.

18. A method, comprising:
receiving, at a data input, a stream of bits having at least one error and having at least one erasure;
generating a first polynomial identifying the at least one error in the stream of bits;
generating a second polynomial identifying at least one erasure in the stream of bits;
generating a third polynomial from the first and second polynomials; and
correcting the errors and erasures in the stream of bits from an algebraic analysis of the third polynomial; and
correcting the errors and erasures in the stream of bits from an inferential analysis of the third polynomial.

19. The method of claim 18, wherein the first polynomial comprises a syndrome polynomials $S(x)$ and the second polynomial comprises an erasure-locator polynomial $\lceil(x))$ and the third polynomial is generated from a Berlekamp algorithm block and comprises an error-locator polynomial $\sigma(x)$ that is a polynomial having roots at the error locations.

20. The method of claim 18, wherein the generating of the third polynomial further comprises one of the approaches comprising: a Forney algorithm approach, a Blahut algorithm approach, an inversionless Forney algorithm approach, an inversionless Blahut algorithm approach, and a dual-line inversionless Blahut algorithm approach.

21. A method, comprising:
receiving, at a data input, a stream of bits having at least one error and having at least one erasure;
generating a first polynomial identifying the at least one error in the stream of bits;
generating a second polynomial identifying at least one erasure in the stream of bits;
generating a third polynomial from the first and second polynomials;
correcting the errors and erasures in the stream of bits from an analysis of the third polynomial to generate a stream of bit without errors or erasures; and identifying the locations of the roots of the third polynomial by passing the third polynomial through a hard decision decoding block.

22. The method of claim 21 wherein the hard-decision decoding further comprises passing the third polynomial through a plurality of Chien-Forney search engines.

23. A method, comprising:
receiving, at a data input, a stream of bits having at least one error and having at least one erasure;
generating a first polynomial identifying the at least one error in the stream of bits;
generating a second polynomial identifying at least one erasure in the stream of bits;
generating a third polynomial from the first and second polynomials; correcting the errors and erasures in the stream of bits from an analysis of the third polynomial to generate a stream of bit without errors or erasures; and
identifying the locations of the roots of the third polynomial by passing the third polynomial through a soft-decision decoding block.

* * * * *